United States Patent
Yang

(10) Patent No.: US 9,627,085 B2
(45) Date of Patent: Apr. 18, 2017

(54) REFRESH METHOD FOR FLASH MEMORY AND RELATED MEMORY CONTROLLER THEREOF

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 150 days.

(21) Appl. No.: 13/967,371

(22) Filed: Aug. 15, 2013

(65) Prior Publication Data
US 2014/0146605 A1 May 29, 2014

Related U.S. Application Data

(60) Provisional application No. 61/731,459, filed on Nov. 29, 2012.

(51) Int. Cl.
| | |
|---|---|
| *G11C 16/34* | (2006.01) |
| *G11C 29/00* | (2006.01) |
| *G11C 11/56* | (2006.01) |

(52) U.S. Cl.
CPC ...... *G11C 16/3431* (2013.01); *G11C 11/5628* (2013.01); *G11C 16/34* (2013.01); *G11C 29/00* (2013.01)

(58) Field of Classification Search
CPC . G11C 16/3431; G11C 11/5628; G11C 29/00; G11C 16/34
USPC ..... 711/103; 714/773, 763; 365/185.09, 222
See application file for complete search history.

(56) References Cited

U.S. PATENT DOCUMENTS

| | | | |
|---|---|---|---|
| 8,243,525 B1 * | 8/2012 | Kan | 365/185.25 |
| 8,938,655 B2 * | 1/2015 | Hamilton et al. | 714/763 |
| 9,270,296 B1 * | 2/2016 | Nemati Anaraki | H03M 13/1105 |
| 2006/0291294 A1 | 12/2006 | Ho | |
| 2009/0161466 A1 * | 6/2009 | Hamilton et al. | 365/222 |
| 2010/0157671 A1 * | 6/2010 | Mokhlesi | G11C 16/3431 365/185.03 |
| 2012/0203951 A1 * | 8/2012 | Wood et al. | 711/102 |
| 2012/0269002 A1 | 10/2012 | Yoon | |

FOREIGN PATENT DOCUMENTS

| | | |
|---|---|---|
| CN | 1937082 A | 3/2007 |
| JP | 200735242 A | 2/2007 |
| KR | 101136273 B1 | 4/2012 |

* cited by examiner

*Primary Examiner* — Han Yang
*Assistant Examiner* — Jerome Leboeuf
(74) *Attorney, Agent, or Firm* — Winston Hsu; Scott Margo

(57) ABSTRACT

A refresh method for a flash memory includes at least the following steps: performing a write operation to store an input data into a storage space in the flash memory; checking reliability of the storage space with the input data already stored therein; and when the reliability of the storage space meets a predetermined criterion, performing a refresh operation upon the storage space based on the input data. For example, the write operation stores the input data into the storage space through an initial program operation and at least one reprogram operation following the initial program operation; and the refresh operation is an additional reprogram operation applied to the storage space for programming the input data recovered from the storage space into original storage locations in the storage space.

16 Claims, 4 Drawing Sheets

REFRESH METHOD FOR FLASH MEMORY AND RELATED MEMORY CONTROLLER THEREOF

CROSS REFERENCE TO RELATED APPLICATIONS

This application claims the benefit of U.S. provisional application No. 61/731,459, filed on Nov. 29, 2012 and incorporated herein by reference.

BACKGROUND OF THE INVENTION

1. Field of the Invention

The disclosed embodiments of the present invention relate to managing data stored in a flash memory, and more particularly, to a refresh method for a flash memory and related memory controller thereof.

2. Description of the Prior Art

Semiconductor memory devices may be classified into volatile memory devices and non-volatile memory devices according to their operating characteristics. The volatile memory devices perform read/write operations at high speed, but lose stored data in the absence of applied power. In contrast, the non-volatile memory devices are able to retain stored data in the absence of applied power. The so-called "flash memory" is one type of non-volatile memory that provides high memory cell integration density. Hence, the flash memory may be adopted as a data storage medium such as a solid-state drive (SSD).

With the advance of the flash memory, one memory cell is capable of storing more than one data bit. However, the programming of such flash memory cells, each capable of storing multiple data bits, requires careful control over the threshold voltage distributions that respectively correspond to different programmed data values. Specifically, increased integration density for a flash memory necessarily requires decreased minimum feature sizes for the memory cells making up the flash memory. At the same time, the coupling effects between floating gates of the constituent memory cells may increase, which may impair the reliability of the flash memory.

Besides, since the size of the floating gate becomes smaller due to increased integration density of the flash memory, the data-retention disturbance becomes an import issue to be solved. In one conventional design, when data-retention disturbance occurs in a block after data is stored into the block, a complicated soft decoding algorithm is employed to recover the stored data in the block through multiple read operations. After the stored data is successfully recovered, one replacement block found in the flash memory is selected and programmed to store the recovered data, and the original block is erased to become a blank block. However, this conventional data-retention recovery scheme increases the number of program/erase (P/E) cycles, which shortens the life of the flash memory inevitable.

SUMMARY OF THE INVENTION

In accordance with exemplary embodiments of the present invention, a refresh method for a flash memory and related memory controller thereof are proposed.

According to a first aspect of the present invention, an exemplary refresh method for a flash memory is disclosed. The exemplary refresh method includes at least the following steps: performing a write operation to store an input data into a storage space in the flash memory; checking reliability of the storage space with the input data already stored therein; and when the reliability of the storage space meets a predetermined criterion, performing a refresh operation upon the storage space based on the input data.

In one exemplary embodiment, the step of checking the reliability of the storage space includes: detecting if the storage space with the input data already stored therein suffers from data-retention disturbance.

In one exemplary embodiment, the storage space is composed of a plurality of N-bit multi-level cells, and N is a positive value greater than two.

In one exemplary embodiment, the write operation stores the input data into the storage space through an initial program operation and at least one reprogram operation following the initial program operation; and the refresh operation is an additional reprogram operation applied to the storage space for programming the input data recovered from the storage space into original storage locations in the storage space.

In one exemplary embodiment, the input data stored in the storage space by the write operation is read based on a first initial setting of reference threshold voltage values, the input data stored in the storage space by the refresh operation is read based a second initial setting of reference threshold voltage values different from the first initial setting of reference threshold voltage values, where a highest reference voltage threshold value defined in the second initial setting of reference threshold voltage values is greater than a highest reference voltage threshold value defined in the first initial setting of reference threshold voltage values. Besides, the refresh method may further comprise: after performing the refresh operation upon the storage space, storing an indicator indicative of the second initial setting of reference threshold voltage values.

In one exemplary design, the storage space is a portion of a block of the flash memory. Besides, the refresh method may further comprise: when the reliability of the storage space meets the predetermined criterion, performing a refresh operation upon a remaining portion of the block of the flash memory.

According to a second aspect of the present invention, an exemplary memory controller of a flash memory is disclosed. The exemplary memory controller has a write circuit, a check circuit and a refresh circuit. The write circuit is coupled to the flash memory, and arranged to store an input data into a storage space in the flash memory. The check circuit is arranged to check reliability of the storage space with the input data already stored therein. The refresh circuit is coupled to the check circuit and flash memory, and arranged to refresh the storage space based on the input data when the reliability of the storage space meets a predetermined criterion.

In one exemplary embodiment, the check circuit checks the reliability of the storage space by detecting if the storage space with the input data already stored therein suffers from data-retention disturbance.

In one exemplary embodiment, the storage space accessed by the memory controller is composed of a plurality of N-bit multi-level cells, and N is a positive value greater than two.

In one exemplary embodiment, the write circuit stores the input data into the storage space through an initial program operation and at least one reprogram operation following the initial program operation, and the refresh circuit performs an additional reprogram operation upon the storage space for programming the input data recovered from the storage space into original storage locations in the storage space.

In one exemplary embodiment, the input data stored in the storage space by the write circuit is read by a first initial setting of reference threshold voltage values, the input data stored in the storage space by the refresh circuit is read based on a second initial setting of reference threshold voltage values different from the first initial setting of reference threshold voltage values, and a highest reference voltage threshold value defined in the second initial setting of reference threshold voltage values is greater than a highest reference voltage threshold value defined in the first initial setting of reference threshold voltage values. Besides, after refreshing the storage space, the refresh circuit stores an indicator indicative of the second initial setting of reference threshold voltage values.

In one exemplary embodiment, the storage space accessed by the memory controller is a portion of a block of the flash memory. Besides, the refresh circuit is further arranged to refresh a remaining portion of the block of the flash memory when the reliability of the storage space meets the predetermined criterion.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The concept of the present invention is to perform a refresh operation to program data into original storage locations in a flash memory again, thus solving the data-retention disturbance issue without increasing the number of P/E cycles. Further details of the proposed data-retention recovery scheme are described as below.

Figure 1:
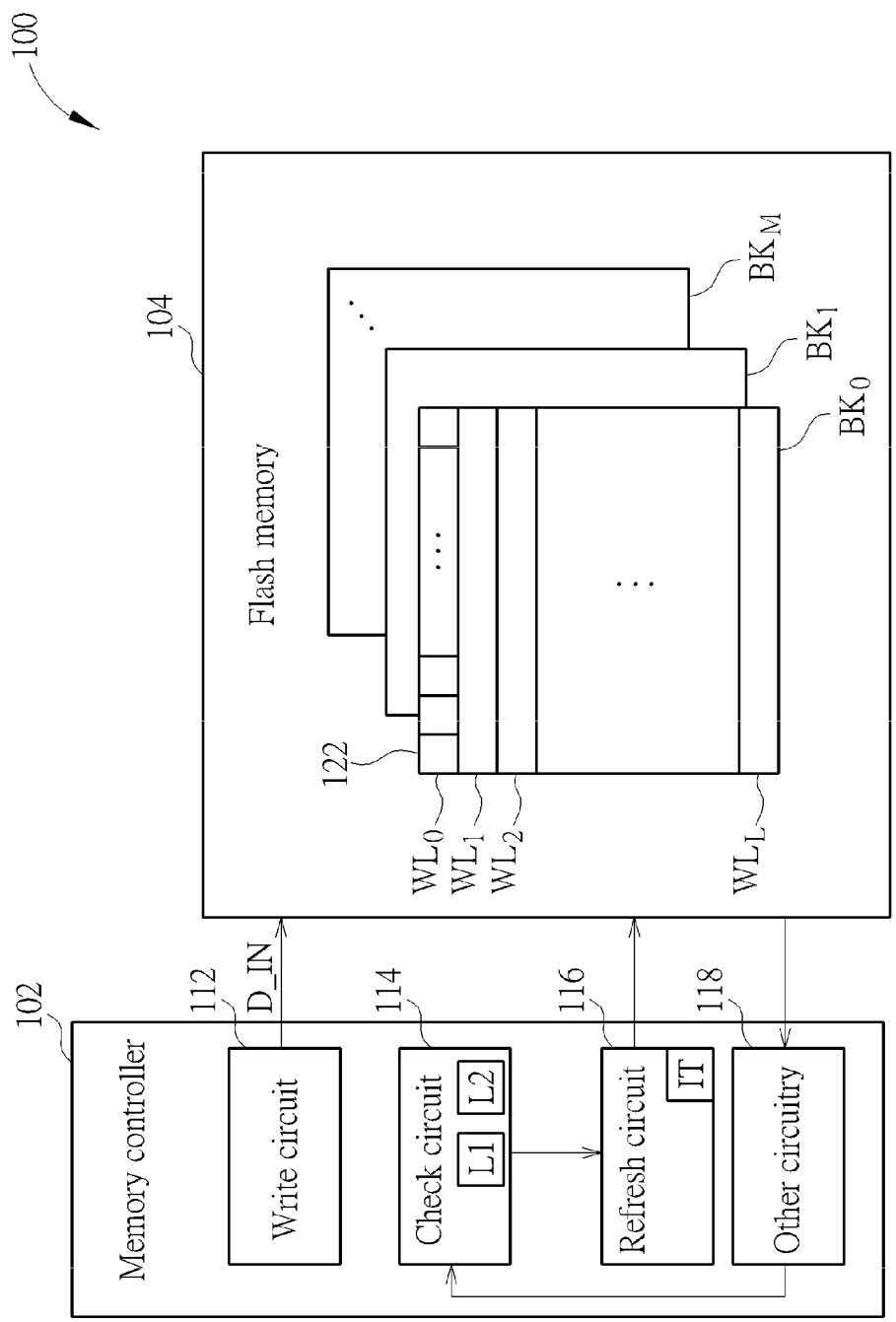
FIG. 1 is a diagram illustrating a flash memory device according to an embodiment of the present invention.

Please refer to FIG. 1, which is a diagram illustrating a flash memory device according to an embodiment of the present invention. The flash memory device 100 includes a memory controller 102 and a flash memory 104. The memory controller 102 is coupled to the flash memory 104, and arranged to control access (i.e., read and write) of the flash memory 104. The memory controller 102 includes a write circuit 112, a check circuit 114, a refresh circuit 116 and other circuitry 118, where other circuitry 118 may include a read circuit, an erase circuit, an error checking and correcting (ECC) circuit, etc. The write circuit 112 is coupled to the flash memory 104, and arranged to store an input data D_IN into a storage space in the flash memory 104, where the storage space is a portion of a block of the flash memory 104 such as memory cells of a single page or memory cells located in a word line. The check circuit 114 is arranged to check reliability of the storage space with the input data D_IN already stored therein. The refresh circuit 116 is coupled to the check circuit 114 and flash memory 104, and arranged to refresh the storage space based on the input data D_IN when the reliability of the storage space meets a predetermined criterion. The operations of write circuit 112, check circuit 114 and refresh circuit 116 are detailed later. As the present invention focuses on a refresh scheme applied to the flash memory 104, further description directed to the erase operation, the read operation and the ECC decoding operation performed by circuit elements included in other circuitry 118 is omitted here for brevity. In addition, the write circuit 112, check circuit 114, refresh circuit 116, and other circuit 118 can be a circuit design that implements certain software or firmware code and at least two circuits of above circuits can share a same hardware to perform different tasks under the control of the software or the firmware.

Regarding the flash memory 104, it has a plurality of blocks $BK_0, BK_1, \ldots, BK_M$, where M may be any positive value, depending upon actual design requirement. Each block has a plurality of memory cells 122 located at different word lines $WL_0, WL_1, WL_2, \ldots, WL_L$, where L may be any positive value, depending upon actual design requirement. For example, L=86. The memory cells 122 located at each word line belong to K pages, where K may be any positive value, depending upon actual design requirement. For example, K=3.

With regard to the data access of the flash memory 104, a page-based read operation may be performed upon the flash memory 104 for reading stored data from memory cells 122 included in a designated page, a page-based write operation may be performed upon the flash memory 104 for programming input data into memory cells 122 included in a designated page, and a block-based erase operation may be performed upon the flash memory 104 for erasing data stored in all memory cells 122 included in a designated block. In this embodiment, each of the memory cells 122 may be an N-bit multi-level cell, where N is a positive value greater than two. For example, each of the memory cells 122 may be a 3-bit multi-level cell (a.k.a. triple-level cell (TLC)).

The coupling effects between floating gates of adjacent memory cells may cause shifting and/or expansion of threshold voltage distributions. Such shifting and/or expansion of threshold voltage distribution would erode read margins, thus resulting in read data errors. To mitigate the shifting and/or expansion of threshold voltage distribution resulting from the coupling effects between floating gates of adjacent memory cells, the write circuit 112 is configured to perform a write operation through an initial program operation and at least one reprogram operation following the initial program operation.

Figure 2:
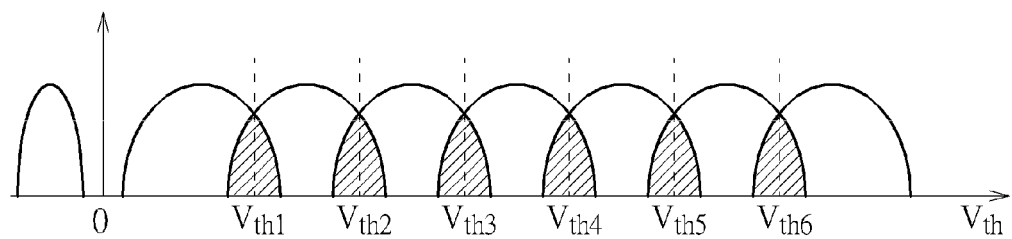
FIG. 2 is a diagram illustrating threshold voltage distributions of memory cells after the execution of a first program operation (i.e., an initial program operation).
Figure 3:
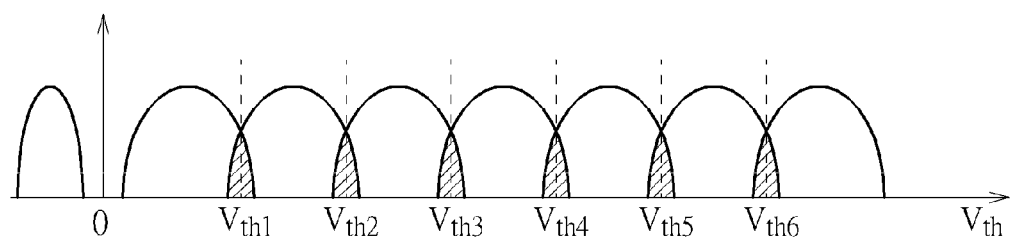
FIG. 3 is a diagram illustrating threshold voltage distributions of memory cells after the execution of a second program operation (i.e., a first reprogram operation).
Figure 4:
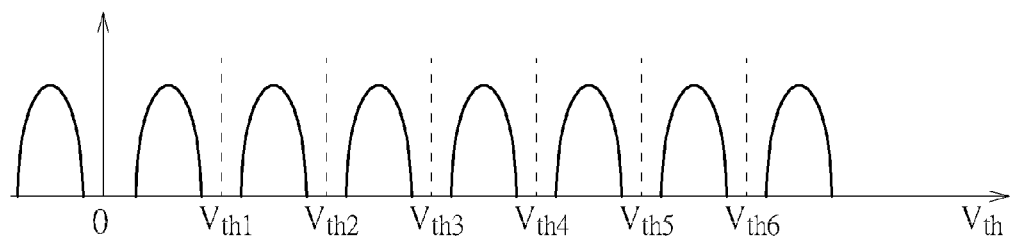
FIG. 4 is a diagram illustrating threshold voltage distributions of memory cells after the execution of a third program operation (i.e., a second reprogram operation).

In a case where the flash memory 104 is a TLC flash memory, each memory cell 122 will be programmed to have one of eight states to store a 3-bit data. When the write circuit 122 writes the input data D_IN into a storage space (e.g., memory cells 122 in word line $WL_0$ of block $BK_0$) of the flash memory 104, a reprogram-based method is used for programming each of the memory cells 122 included in the designated storage space. FIG. 2 is a diagram illustrating threshold voltage distributions of memory cells after the execution of a first program operation (i.e., an initial program operation). With regard to each memory cell 122, the initial program operation directly makes the memory cell 122 programmed to a target state based on a 3-bit data to be stored. As shown in FIG. 2, the reference threshold voltages 0 and $V_{TH1}$-$V_{TH6}$ are used to distinguish between different states. Although the initial program operation has been performed, it may be difficult to clearly distinguish between different states due to threshold voltage distributions disturbed by coupling effects between floating gates of adjacent memory cells. More specifically, there are ambiguous data value regions (which are marked by oblique lines). Hence, a first reprogram operation is executed. FIG. 3 is a diagram illustrating threshold voltage distributions of memory cells after the execution of a second program operation (i.e., a first reprogram operation). The first reprogram operation is used to refine the threshold voltage distribution resulting from the initial program operation. As can be seen from FIG. 3, the second program operation (i.e., the first reprogram operation) better defines the threshold voltage distributions for different states, where the sizes of the ambiguous data regions are reduced. Nevertheless, it is still possible to erroneously read a programmed memory cell having a threshold voltage in the ambiguous data value region. Hence, a second reprogram operation is executed. FIG. 4 is a diagram illustrating threshold voltage distributions of memory cells after the execution of a third program operation (i.e., a second reprogram operation). As can be seen from FIG. 4, once the second reprogram operation has been executed, the respective threshold voltage distributions for different states are all clearly distinguishable.

Figure 5:
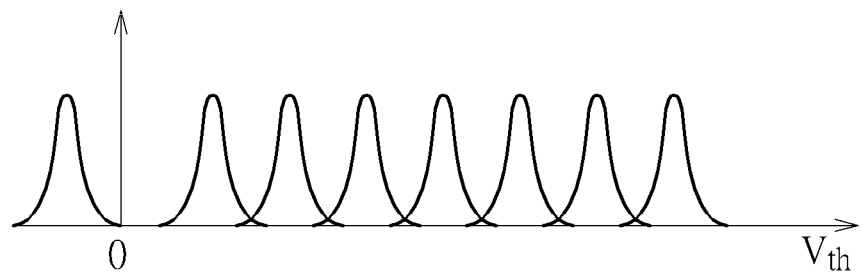
FIG. 5 is a diagram illustrating threshold voltage distributions of memory cells when data-retention disturbance happens.

Though the reprogram-based method employed by the write circuit 112 can make the threshold voltage distributions more narrow and better defined within the desired ranges to allow a following read operation to correctly distinguish between different states possessed by the programmed memory cells 122, the data-retention disturbance of the programmed memory cells 122 may still happen. When the data-retention disturbance happens, the threshold voltage distributions for different states may shift down with bell-shaped broadening. FIG. 5 is a diagram illustrating threshold voltage distributions of memory cells when the data-retention disturbance happens. As the threshold voltage distributions are changed due to data-retention disturbance, using the initial reference threshold voltages may have read data errors. In other words, when reliability of a storage space (e.g., memory cells 122 in word line $WL_0$ of block $BK_0$) with the input data D_IN already stored therein is degraded, the memory controller 102 may have difficulty in reading correct stored data from the storage space of the flash memory 104. In this embodiment, the check circuit 114 checks reliability of the storage space with the input data already stored therein, and the refresh circuit 116 performs the refresh operation upon the storage space based on the input data D_IN when the reliability of the storage space meets a predetermined criterion. For example, the check circuit 114 detects if the storage space with the input data D_IN already stored therein suffers from data-retention disturbance, and judges that the reliability of the storage space meets the predetermined criterion when detecting the occurrence of the data-retention disturbance. In one exemplary design, the check circuit 114 may refer to information provided by the ECC circuit included in other circuitry 118 to judge whether data-retention disturbance occurs. For example, when the ECC circuit encounters a decoding failure or determines a number of error bits exceeding a threshold when applying a decoding operation (e.g. a hard decoding operation or a soft decoding) upon stored data read from the storage space in the flash memory 104, the check circuit 114 determines that the memory cells 122 in the storage space suffers from data-retention disturbance. A refresh-based data-retention recovery is enabled to recover stored data in the storage space (e.g., word line $WL_0$ of block $BK_0$). For example, a complicated decoding algorithm (e.g. soft decoding algorithm) is executed by the ECC circuit to recover the stored data through multiple read operations.

Generally speaking, one TLC block may need three SLC blocks to buffer the recovered data of the TLC block. In one exemplary design, the memory controller 102 may store recovered data of one TLC block into three SLC blocks allocated in the flash memory 104. In another exemplary design, the recovered data of one TLC block may be stored in internal buffers of the memory controller 102.

Figure 6:
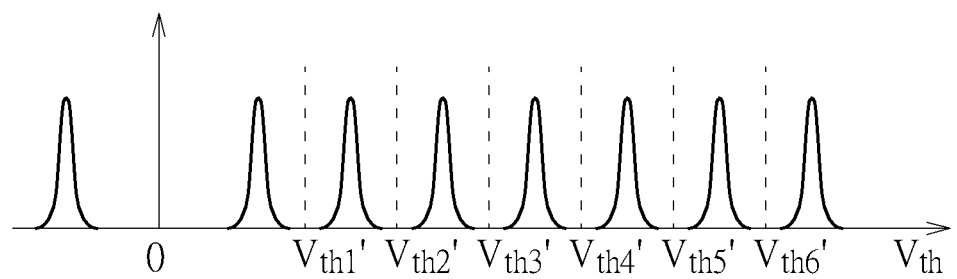
FIG. 6 is a diagram illustrating threshold voltage distributions of memory cells after a refresh operation is performed.

After the stored data (i.e., the input data D_IN) is successfully recovered from the storage space suffering from data-retention disturbance, the refresh circuit 116 is instructed by the check circuit 114 to perform a refresh operation upon the storage space (e.g., memory cells 122 in word line $WL_0$ of block $BK_0$). In this embodiment, as the write circuit 112 employs a reprogram-based method for writing the input data D_IN into the storage space in the flash memory 104, the refresh operation performed by the refresh circuit 116 is an additional reprogram operation applied to the storage space for writing the input data D_IN recovered from the storage space into original storage locations in the storage space. Therefore, the threshold voltage distributions shown in FIG. 5 are refined by the additional reprogram operation performed by the refresh circuit 116. FIG. 6 is a diagram illustrating threshold voltage distributions of memory cells after the refresh operation is performed. In a preferred embodiment, the refresh circuit 116 is configured to refer to the input data D_IN recovered from the storage space to write memory cells 122 located at the original storage locations in the storage space to higher threshold values, thus achieving sharper threshold voltage distributions with good noise margins. To put it another away, the input data D_IN stored in the storage space by the write circuit 112 is read based on a first initial setting of reference threshold voltage values (i.e., 0 and $V_{th1}$-$V_{th6}$ shown in FIG. 4), and the input data stored in the storage space by the refresh circuit 116 is read based on a second initial setting of reference threshold voltage values (i.e., 0 and $V_{th1}'$-$V_{th6}'$ shown in FIG. 6) different from the first initial setting of reference threshold voltage values. Besides, the highest reference threshold voltage value (i.e., $V_{th6}'$) defined in the second initial setting of reference threshold voltage values is greater than the highest reference threshold voltage value (i.e., $V_{th6}$) defined in the first initial setting of reference threshold voltage values.

As mentioned above, the second initial setting of reference threshold voltage values (i.e., 0 and $V_{th1}'$-$V_{th6}'$) is different from first initial setting of reference threshold voltage values (i.e., 0 and $V_{th1}$-$V_{th6}$) after the refresh operation is done. Thus, to facilitate following read operations, the refresh circuit 166 is arranged to further store an indicator IT indicative of the second initial setting of reference threshold voltage values. In this way, the read circuit included in other circuitry 118 can refer to the indicator IT to use the correct reference threshold voltage values 0, $V_{th1}'$-$V_{th6}'$ for performing a read operation upon the storage space which has been refreshed by the refresh circuit 116. The indicator IT indicative of the second initial setting of reference threshold voltage values can be stored in a corresponding table in the memory controller 102.

As data in the same block may be stored sequentially (e.g., stored in a small time period), the proposed refresh operation may be a block-based operation. For example, when data stored in one of word lines in a block is found affected by data-retention disturbance, the whole block can be refreshed by the refresh circuit 116. For example, when the check circuit 114 finds that memory cells 122 in word line $WL_0$ of block $BK_0$ suffers from data-retention disturbance, the refresh circuit 116 can refresh all word lines $WL_0$-$WL_L$ of the same block $BK_0$. Preferably, to achieve better threshold voltage distribution refinement result, the order of refreshing word lines in a block depends on the order of writing data into word lines in the block. For example, when the write circuit 112 employs a reprogram method to write data into word lines $WL_0$-$WN_L$ of block $BK_0$ sequentially, the refresh circuit 116 applies the refresh operation to word lines $WL_0$-$WN_L$ of block $BK_0$ sequentially.

Figure 7:
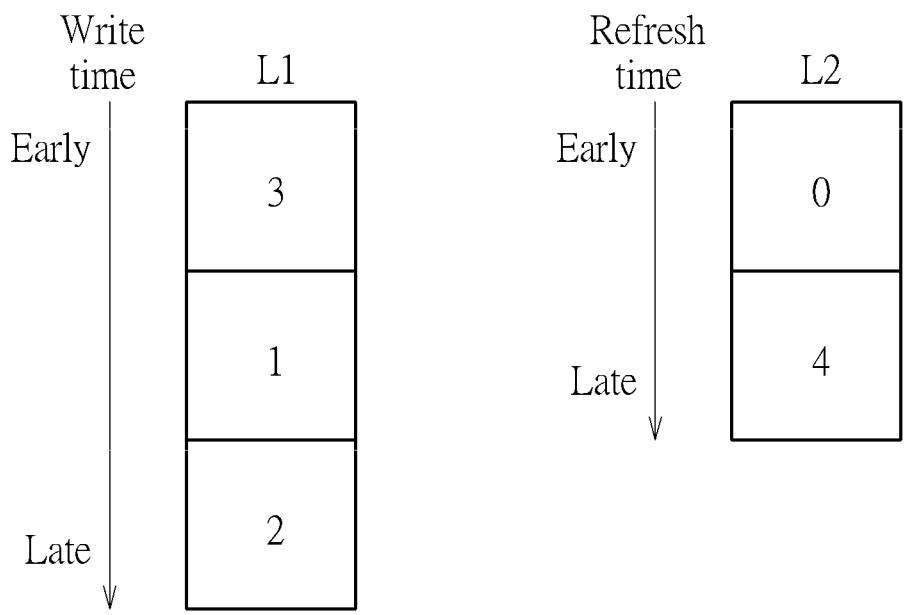
FIG. 7 is a diagram illustrating an example of a first list L1 and a second list L2 recorded by a check circuit.
Figure 8:
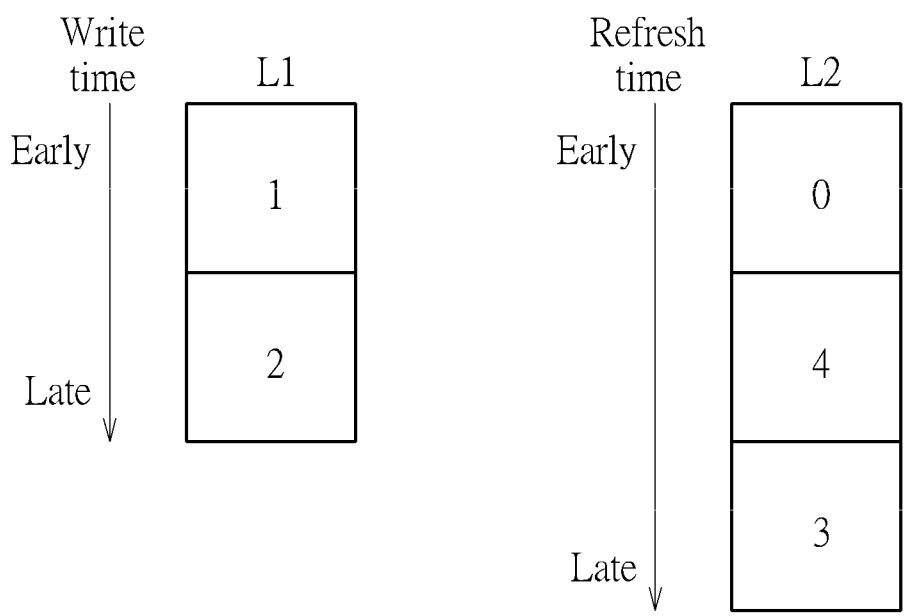
FIG. 8 is a diagram illustrating an example of the updated first list L1 and the updated second list L2 recorded by the check circuit.

In a preferred embodiment, the refresh-based data-retention recovery is performed in the background without interfering with the normal data access of the flash memory 104. For example, the check circuit 114 instructs the read circuit and the ECC circuit included in other circuitry 118 to detect occurrence of data-retention disturbance in at least one of the blocks $BK_0$-$BK_M$ each time the flash memory device 100 is powered up. The check circuit 114 may maintain a first list L1 and a second list L2, where the first list L1 records index values of blocks written by the write circuit 112 but not refreshed by the refresh circuit 116 yet in an ascending order of write time or a descending order of write time, and the second list L2 records index values of blocks refreshed by the refresh circuit 116 in an ascending order of refresh time or a descending order of refresh time. FIG. 7 is a diagram illustrating an example of the first list L1 and the second list L2 recorded by the check circuit 114. The exemplary first list L1 records index values '3', '1' and '2' in order, implying that the write circuit 112 writes data into block $BK_3$ before writing data into block $BK_1$, and the write circuit 112 writes data into block $BK_1$ before writing data into block $BK_2$. The exemplary second list L2 records index values '0' and '4' in order, implying that the refresh circuit 116 refreshes block $BK_0$ before refreshing block $BK_4$. With the help of the first list L1, the check circuit 114 knows that the block $BK_3$ has stored data with the earliest write time and thus has the highest occurrence probability of data-retention disturbance among blocks $BK_1$, $BK_2$, $BK_3$. Similarly, with the help of the second list L2, the check circuit 114 knows that the block $BK_0$ has stored data with the earliest refresh time and thus has the highest occurrence probability of data-retention disturbance among blocks $BK_0$ and $BK_4$. When the flash device 100 is powered up, the check circuit 114 instructs the read circuit and ECC circuit included in other circuitry 118 to read stored data (e.g., data of one word line) from block $BK_3$ and perform a hard decoding operation upon data read from block $BK_3$. Besides, when the flash device 100 is powered up (or any other predefined time, or while the memory controller 102 is idle), the check circuit 114 further instructs the read circuit and ECC circuit included in other circuitry 118 to read stored data (e.g., data of one word line) from block $BK_0$ and perform a hard decoding operation upon data read from block $BK_0$. Suppose that the hard decoding of the data read from block $BK_3$ has a decoding failure, the refresh circuit 116 is activated to perform the aforementioned refresh operation upon block $BK_3$. Suppose that the hard decoding of the data read from block $BK_0$ is successful, no further data-retention recovery is applied to block $BK_0$. When the aforementioned refresh operation is performed upon block $BK_3$, the first list L1 and the second list L2 are updated by the check circuit 114 correspondingly. FIG. 8 is a diagram illustrating an example of the updated first list L1 and the updated second list L2 recorded by the check circuit 114. As shown in FIG. 8, the updated first list L1 now records index values '1' and '2' in order, and the updated list L2 now records index values '0', '4' and '3' in order. Hence, at the next power-up of the flash device 100, data stored in blocks $BK_1$ (which is indicated by first list L1 to have the highest occurrence probability of data-retention disturbance among blocks $BK_1$ and $BK_2$) and $BK_0$ (which is indicated by second list L2 to have the highest occurrence probability of data-retention disturbance among blocks $BK_0$, $BK_4$, and $BK_3$) will be checked.

Consider a case where the hard decoding of the data read from block $BK_0$ (which is indicated by second list L2 to have the highest occurrence probability of data-retention disturbance among all refreshed blocks) has a decoding failure. In one exemplary design, the refresh circuit 116 may be activated to perform the refresh operation upon the block $BK_0$ again. In another exemplary design, a conventional data-retention recovery scheme may be activated to program data recovered from the block $BK_0$ into a replacement block and erase the block $BK_0$.

Compared to the conventional data-retention recovery scheme which erases a block suffering from data-retention disturbance, the proposed data-retention recovery scheme of the present invention refreshes the block instead of erasing the block. In this way, the number of P/E cycles of the flash memory 104 is not increased. Moreover, compared to the conventional data-retention recovery scheme which moves data in a block suffering from data-retention disturbance to another block, the proposed data-retention recovery scheme of the present invention refreshes the block without any data movement. Hence, there is no need to update a logical-to-physical address mapping table, where the logical-to-physical address mapping table may be used under a page mode or a block mode. Specifically, when the logical-to-physical address mapping table is used under a page mode, the logical-to-physical address mapping table is referenced for logical-to-physical page translation. When the logical-to-physical address mapping table is used under a block mode, the logical-to-physical address mapping table is referenced for logical-to-physical block translation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A refresh method for a flash memory, comprising:
    performing a write operation to store an input data into a storage space in the flash memory, the write operation comprising an initial program operation, a first reprogram operation, and a second reprogram operation which are sequentially performed;
    checking reliability of the storage space with the input data already stored therein, the checking step comprising: detecting if the storage space with the input data already stored therein suffers from data-retention disturbance; and
    when the checking steps indicates that the storage space suffers from the data-retention disturbance, performing a refresh operation upon the storage space based on the input data, and the refresh operation comprises:
        recovering the input data from the storage space; and
        programming the input data recovered from the storage space into original storage locations in the storage space, the programming step being an additional reprogram operation applied to the storage space and different and distinct from the initial program operation, the first reprogram operation, and the second reprogram operation;
    wherein the input data stored in the storage space by the write operation is read based on a first initial setting of reference threshold voltage values, and the input data stored in the storage space by the refresh operation is read based on a second initial setting of reference threshold voltage values different from the first initial setting of reference threshold voltage values; the second initial setting of reference threshold voltage values corresponds to threshold voltage distributions that are sharper than threshold voltage distributions of the first initial setting of reference threshold voltage values.

2. The refresh method of claim 1, wherein the storage space is composed of a plurality of N-bit multi-level cells, and N is a positive value greater than two.

3. The refresh method of claim 1, wherein the write operation stores the input data into the storage space through an initial program operation and at least one reprogram operation following the initial program operation.

4. The refresh method of claim 3, wherein the refresh operation is an additional reprogram operation applied to the storage space for programming the input data recovered from the storage space into the original storage locations in the storage space.

5. The refresh method of claim 1, wherein a second highest reference threshold voltage value defined in the second initial setting of reference threshold voltage values is greater than a first highest reference threshold voltage value defined in the first initial setting of reference threshold voltage values.

6. The refresh method of claim 1, further comprising:
    after performing the refresh operation upon the storage space, storing an indicator indicative of the second initial setting of reference threshold voltage values.

7. The refresh method of claim 1, wherein the storage space is a portion of a block of the flash memory.

8. The refresh method of claim 7, further comprising:
    when the reliability of the storage space meets the predetermined criterion, performing a refresh operation upon a remaining portion of the block of the flash memory.

9. A memory controller of a flash memory, comprising:
    a write circuit, coupled to the flash memory, the write circuit arranged to performing a write operation to store an input data into a storage space in the flash memory, the write operation comprising an initial program operation, a first reprogram operation, and a second reprogram operation which are sequentially performed;
    a check circuit, arranged to check reliability of the storage space with the input data already stored therein, the check circuit detecting if the storage space with the input data already stored therein suffers from data-retention disturbance; and
    a refresh circuit, coupled to the check circuit and the flash memory, the refresh circuit arranged to refresh the storage space based on the input data when the check circuit indicates that the storage space suffers from the data-retention disturbance;
    wherein the refresh circuit recovers the input data from the storage space and then programs the input data recovered from the storage space into original storage locations in the storage space, the programming being an additional reprogram operation applied to the storage space and different and distinct from the initial program operation, the first reprogram operation, and the second reprogram operation; the input data stored in the storage space by the write circuit is read based on a first initial setting of reference threshold voltage values, and the input data stored in the storage space by the refresh circuit is read based on a second initial setting of reference threshold voltage values different from the first initial setting of reference threshold voltage values; the second initial setting of reference threshold voltage values corresponds to threshold voltage distributions that are sharper than threshold voltage distributions of the first initial setting of reference threshold voltage values.

10. The memory controller of claim 9, wherein the storage space accessed by the memory controller is composed of a plurality of N-bit multi-level cells, and N is a positive value greater than two.

11. The memory controller of claim 9, wherein the write circuit stores the input data into the storage space through an initial program operation and at least one reprogram operation following the initial program operation.

12. The memory controller of claim 11, wherein the refresh circuit performs an additional reprogram operation upon the storage space for programming the input data recovered from the storage space into the original storage locations in the storage space.

13. The memory controller of claim 9, wherein a second highest reference threshold voltage value defined in the second initial setting of reference threshold voltage values is greater than a first highest reference threshold voltage value defined in the first initial setting of reference threshold voltage values.

14. The memory controller of claim 9, wherein after refreshing the storage space, the refresh circuit stores an indicator indicative of the second initial setting of reference threshold voltage values.

15. The memory controller of claim 9, wherein the storage space accessed by the memory controller is a portion of a block of the flash memory.

16. The memory controller of claim 15, wherein the refresh circuit is further arranged to refresh a remaining portion of the block of the flash memory when the reliability of the storage space meets the predetermined criterion.

* * * * *